(12) United States Patent
Komatsu et al.

(10) Patent No.: US 8,174,009 B2
(45) Date of Patent: May 8, 2012

(54) ORGANIC ELECTROLUMINESCENCE ELEMENT AND MANUFACTURING METHOD THEREOF

(75) Inventors: Takahiro Komatsu, Osaka (JP); Kei Sakanoue, Fukuoka (JP); Tetsuro Kondoh, Osaka (JP); Ryuuta Yamada, Osaka (JP); Kenichi Nendai, Kyoto (JP); Takayuki Takeuchi, Osaka (JP)

(73) Assignee: Panasonic Corporation, Osaka (JP)

( * ) Notice: Subject to any disclaimer, the term of this patent is extended or adjusted under 35 U.S.C. 154(b) by 324 days.

(21) Appl. No.: 12/555,938

(22) Filed: Sep. 9, 2009

(65) Prior Publication Data

US 2010/0102310 A1   Apr. 29, 2010

(30) Foreign Application Priority Data

Oct. 24, 2008   (JP) ................. 2008-274880

(51) Int. Cl.
*H01L 29/10* (2006.01)
(52) U.S. Cl. ............... 257/43; 257/40; 257/E51.001; 257/79
(58) Field of Classification Search .......... 257/40, 257/43, 79, E51.001
See application file for complete search history.

(56) References Cited

U.S. PATENT DOCUMENTS

| | | | |
|---|---|---|---|
| 5,294,869 A | 3/1994 | Tang et al. | |
| 5,688,551 A | 11/1997 | Littman et al. | |
| 6,249,085 B1 | 6/2001 | Arai | |
| 6,784,459 B2 | 8/2004 | Seki et al. | |
| 6,861,800 B2 | 3/2005 | Tyan et al. | |
| 6,875,320 B2 | 4/2005 | Raychaudhuri et al. | |
| 6,924,593 B2 | 8/2005 | Seki et al. | |
| 7,153,592 B2 | 12/2006 | Yoshikawa | |
| 7,186,581 B2 | 3/2007 | Seki et al. | |
| 7,208,234 B2 | 4/2007 | Yoshikawa | |
| 7,470,976 B2 | 12/2008 | Seki et al. | |
| 7,521,709 B2 | 4/2009 | Seki et al. | |
| 2002/0051894 A1 | 5/2002 | Yoshikawa | |
| 2002/0064966 A1 | 5/2002 | Seki et al. | |
| 2004/0140757 A1 | 7/2004 | Tyan et al. | |
| 2004/0140758 A1 | 7/2004 | Raychaudhuri et al. | |
| 2004/0155576 A1 | 8/2004 | Tyan et al. | |
| 2004/0160172 A1 | 8/2004 | Tyan et al. | |
| 2004/0161192 A1 | 8/2004 | Hamano et al. | |
| 2004/0166761 A1 | 8/2004 | Seki et al. | |
| 2004/0222737 A1 | 11/2004 | Raychaudhuri et al. | |

(Continued)

FOREIGN PATENT DOCUMENTS

JP    9-63771    3/1997

(Continued)

OTHER PUBLICATIONS

English language Abstract of JP 2004-171951, Jun. 17, 2004.

(Continued)

*Primary Examiner* — Anthony Ho
(74) *Attorney, Agent, or Firm* — Greenblum & Bernstein, P.L.C.

(57) ABSTRACT

To provide an organic electroluminescence element including a structure that facilitates manufacturing of a large scale organic EL panel and a manufacturing method thereof, the organic electroluminescence element includes: an anode; a cathode; an organic luminescent layer located between the anode and the cathode; and a hole injection layer located between the anode and the organic luminescent layer. The hole injection layer comprises a mixture of molybdenum oxide and tungsten oxide that contains a molybdenum element in a range of 9 atomic percent to 35 atomic percent.

11 Claims, 9 Drawing Sheets

U.S. PATENT DOCUMENTS

| | | |
|---|---|---|
| 2005/0170208 A1 | 8/2005 | Yatsunami et al. |
| 2005/0208206 A1 | 9/2005 | Yoshikawa |
| 2005/0248267 A1 | 11/2005 | Gyoutoku et al. |
| 2005/0264186 A1 | 12/2005 | Seki et al. |
| 2005/0264187 A1 | 12/2005 | Seki et al. |
| 2005/0266169 A1 | 12/2005 | Seki et al. |
| 2006/0204788 A1 | 9/2006 | Yoshikawa |
| 2006/0284166 A1 | 12/2006 | Chua et al. |
| 2007/0018152 A1 | 1/2007 | Seki et al. |
| 2007/0063639 A1 | 3/2007 | Hamano et al. |
| 2007/0065180 A1 | 3/2007 | Yatsunami |
| 2007/0172978 A1 | 7/2007 | Chua et al. |
| 2007/0241665 A1 | 10/2007 | Sakanoue et al. |
| 2008/0315760 A1 | 12/2008 | Seki et al. |
| 2009/0009075 A1 | 1/2009 | Seki et al. |
| 2009/0160325 A1 | 6/2009 | Yatsunami et al. |
| 2009/0284141 A1 | 11/2009 | Sakanoue et al. |
| 2011/0068327 A1* | 3/2011 | Morishima ............ 257/40 |
| 2011/0220877 A1* | 9/2011 | Morishima ............ 257/40 |

FOREIGN PATENT DOCUMENTS

| | | |
|---|---|---|
| JP | 2000-268973 | 9/2000 |
| JP | 2002-75661 | 3/2002 |
| JP | 2002-222695 | 8/2002 |
| JP | 3369615 | 11/2002 |
| JP | 2004-171951 | 6/2004 |
| JP | 2004-228081 | 8/2004 |
| JP | 2004-335468 | 11/2004 |
| JP | 2005-203339 | 7/2005 |
| JP | 3789991 | 4/2006 |
| JP | 2007-527542 | 9/2007 |
| JP | 2007-288071 | 11/2007 |
| WO | 2004/100282 | 11/2004 |

OTHER PUBLICATIONS

English language Abstract of JP 2007-288071, Nov. 1, 2007.
English language Abstract of JP 2002-222695, Aug. 9, 2002.
English language Abstract of JP 2007-527542, Sep. 27, 2007.
English language Abstract of JP 5-258859, Oct. 8, 1993.
English language Abstract of JP 9-167684, Jun. 24, 1997.
English language Abstract of JP 2005-203339, Jul. 28, 2005.
English language Abstract of JP 9-63771, Mar. 7, 1997.
English language Abstract of JP 2000-268973, Sep. 29, 2000.
English language Abstract of JP 2002-75661, Mar. 15, 2002.
English language Abstract of JP 2004-228081, Aug. 12, 2004.
English language Abstract of JP 2004-335468, Nov. 25, 2004.
"Applied Physics", ISSN:0022-3727, vol. 29 No. 11, Institute of Physics Publishing Ltd., pp. 2750-2753, Nov. 14, 1996.

* cited by examiner

Mo doping concentration (0 atomic %)

Mo doping concentration (9 atomic %)

ORGANIC ELECTROLUMINESCENCE ELEMENT AND MANUFACTURING METHOD THEREOF

BACKGROUND OF THE INVENTION (1) Field of the Invention

The present invention relates to organic electroluminescence elements, and particularly relates to manufacturing a top-emission organic electroluminescence element and a manufacturing method thereof.

(2) Description of the Related Art

The organic electroluminescence element (hereinafter, described as an organic EL element), which has a structure in which an organic layer including a luminescent layer is sandwiched between an anode and a cathode, is a device that takes out illumination by injecting holes through the anode and electrons through the cathode and recombining the injected holes and electrons inside the luminescent layer.

The organic EL element is characterized by having high visibility because of its self-luminousness and also having excellent impact resistance because it is a complete solid-state device. The use of it as a light-emitting element in a variety of display apparatuses has been receiving widespread attention (for example, see Patent Reference 1). The organic EL element has already been used for various purposes, including use for the main display of cell phones.

In the current stage of development and application, the development of an organic EL element using a low-molecular organic material for a luminescent layer is advanced. This is because the organic EL element has high luminance efficiency and long lifetime when using a low-molecular organic material for the luminescent layer (for example, see Patent References 2 and 3). The luminescent layer made of such a low-molecular organic material is manufactured using vacuum processing such as vacuum deposition.

However, the organic EL manufacturing method using such vacuum processing hardly allows mass-production of large scale organic EL panels such as 100-inch panels. This is because when using a deposition technique, it is difficult to maintain mask alignment accuracy for each color (for example, R, G, and B) in mask deposition in the process of forming the luminescent layer. In addition, in the case of using the deposition technique, problems such as the problem of film uniformity in the process of forming an electrode layer pose a technical impediment to the manufacturing of the large scale organic EL panels. In addition, in terms of costs in which the manufacturing method is reflected, the organic EL element is behind a liquid crystal display which rivals the organic EL element.

Whereas, a method for manufacturing an organic layer by wet processing has advantages in terms of: material use efficiency, manufacturing time, and manufacturing apparatus costs. In addition, when applying this method to manufacturing of the display, since pixels are separately colored in large area by a printing method, problems such as non-uniformity in a surface direction as seen in the case of vacuum deposition or deflection of a metal mask used for patterning the deposition layer are not observed.

On the other hand, in the case of forming multiple organic layers by the wet processing, there is a problem of difficulty in forming such multiple layers because dropping a solution onto an upper layer generally causes a lower layer to be eluted into the solution. Since the performance of the organic EL element can be improved by stacking multiple organic layers having various functions, this is an important problem. Therefore, the performance of the organic EL element manufactured by the wet processing is lower than the performance of the organic EL element manufactured by the vacuum deposition method. For practical application of the organic EL element using the wet processing, it is essential to select the device structure and the material appropriate for the wet processing and to develop the manufacturing method thereof.

Patent Reference 4, for example, discloses a device structure of a multilayer organic EL element manufactured by the wet processing and the manufacturing method thereof. Patent Reference 4 discloses forming, by an ink-jet method, a hole injection layer made of an aqueous organic substance PEDOT on an electrode on a substrate. From above, a material having hole transportability and including a cross linker is formed, along with an organic solvent, into a film, and a link is formed by optical treatment after the film formation so as to insolubilize the material. Next, as a luminescent layer, a third layer made of a luminescent organic material is formed into a film along with the organic solvent. Finally, the cathode is formed by deposition, so that an element is formed.

In addition, Patent Reference 5 discloses forming, as an inorganic hole injection layer, a metal-oxide layer having a large work function and thus having an advantage in hole injection in terms of energy level. Since these layers are insoluble to an organic solvent, the problem of elusion is not caused in the case of wet-applying an organic solvent from above.

Patent Reference 1: Japanese Unexamined Patent Application Publication No. 2004-171951.

Patent Reference 2: Japanese Unexamined Patent Application Publication No. 2007-288071.

Patent Reference 3: Japanese Unexamined Patent Application Publication No. 2002-222695.

Patent Reference 4: Japanese Unexamined Patent Application Publication (Translation of PCT Application) No. 2007-527542.

Patent Reference 5: Japanese Patent: 3369615.

However, in the case of using the PEDOT for the hole injection layer, the deterioration of the device is accelerated by diffusion of sulfonic acid into the organic layer. In addition, a water-soluble conductive material represented by the PEDOT solution is acidic solution and has a problem of causing corrosion to equipment such as an ink-jet nozzle. In addition, the material is not a complete solution but is made up of diffused fine particles, thus causing a problem of clogging the ink-jet nozzle. Furthermore, its conductivity, which is too high, causes a leakage current to increase when even a portion of this film has contact with the cathode.

On the other hand, in the case of using a metal oxide for the hole injection layer, since the deposition method requiring a high temperature for film formation is generally used for forming a metal oxide layer having a larger work function, crystallization is promoted. When crystallization is promoted, the film becomes less planarized, so that pinholes are generated in an organic luminescent layer that is an upper layer. In addition, when increasing the thickness of the metal oxide film to avoid the generation of such pinholes, electric resistance of the film increases, and requires, as a result, a high drive voltage, thus causing power consumption to increase.

In addition, it is possible to give molybdenum oxide as a metal-oxide layer having sufficient film flatness and having a large work function. However, the molybdenum oxide is water-soluble and solves into an aqueous solution used for such processing as patterning the organic luminescent layer and forming a pixel separation bank, thus making it difficult to obtain an oxidized film having a desired flatness and thickness.

When the organic EL element is realized using the organic luminescent layer formed by a wet film forming method in order to achieve a larger area of the image display unit and reduce manufacturing costs, the hole injection layer has such problems as described above.

SUMMARY OF THE INVENTION

In view of the above problems, an object of the present invention is to provide an organic EL element which requires a low drive voltage and has high luminance efficiency, and has a structure which facilitates manufacturing of a large scale organic EL panel and the manufacturing method thereof.

In order to achieve the object described above, an organic electroluminescence element (hereinafter, described as an organic EL element) according to an aspect of the present invention includes: an anode; a cathode; an organic luminescent layer formed between the anode and the cathode; and a hole injection layer which is formed between the anode and the organic luminescent layer and is a mixture of molybdenum oxide and tungsten oxide, and which contains a molybdenum element at a ratio of 9 atomic % to 35 atomic % inclusive.

According to the organic EL element in the aspect of the present invention, since the hole injection layer is made of a mixture of molybdenum oxide and tungsten oxide, it is possible to achieve sufficient hole injection performance and surface flatness of the hole injection layer. Accordingly, the organic EL element according to the aspect of the present invention requires low drive voltage and has high luminance efficiency, thereby making it possible to facilitate increasing the size of the organic EL element and the mass production thereof.

FURTHER INFORMATION ABOUT TECHNICAL BACKGROUND TO THIS APPLICATION

The disclosure of Japanese Patent Application No. 2008-274880 filed on Oct. 24, 2008 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT

Figure 1:
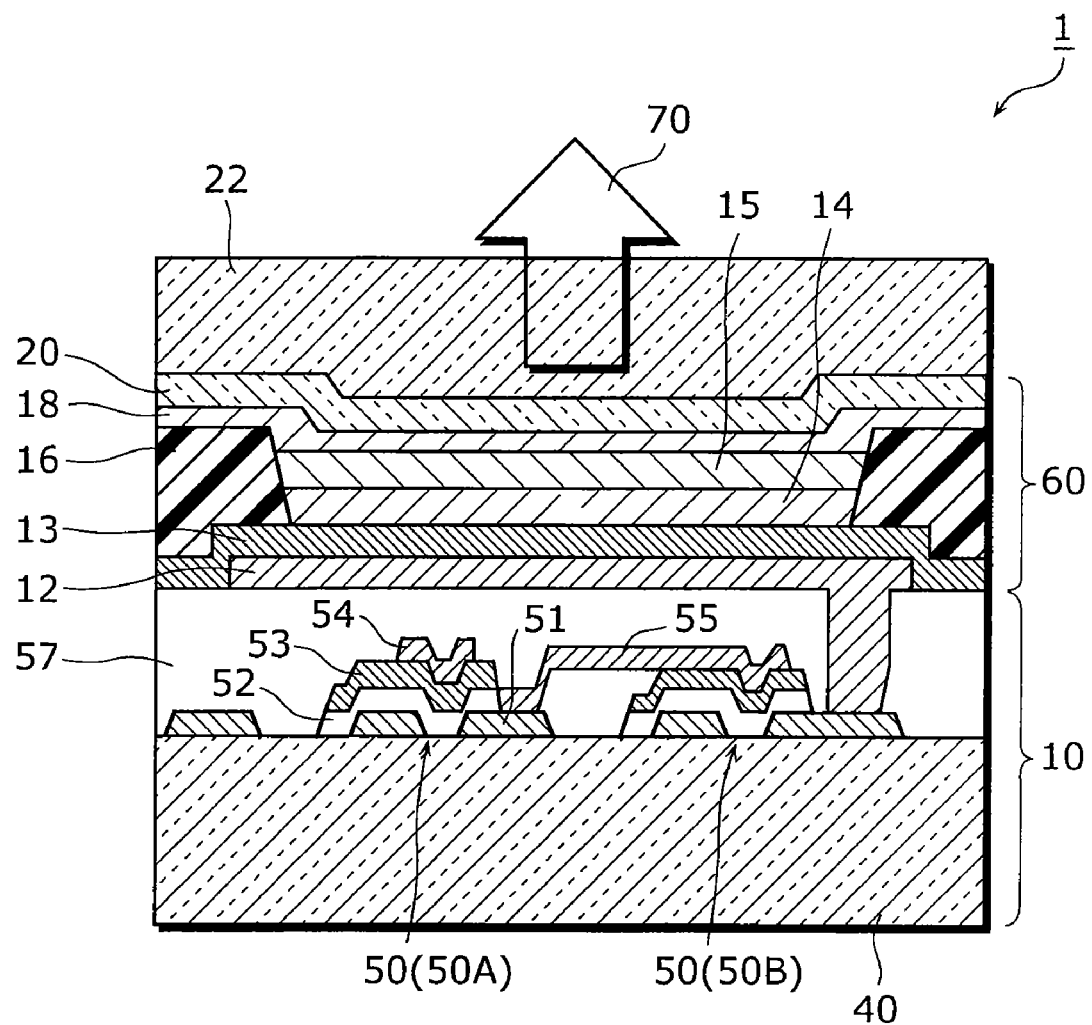
FIG. 1 is a structural cross-sectional diagram of an active-matrix organic EL element according to an embodiment of the present invention.

An organic electroluminescence element according to an aspect of the present invention is an organic electroluminescence element including: an anode; a cathode; an organic luminescent layer formed between the anode and the cathode; and a hole injection layer which is formed between the anode and the organic luminescent layer and is a mixture of molybdenum oxide and tungsten oxide, and which contains a molybdenum element at a ratio of 9 atomic % to 35 atomic % inclusive.

According to the aspect of the present invention, a hole injection layer is made of a mixture of molybdenum oxide and tungsten oxide, and that a content rate of the molybdenum element with respect to a metal element in the mixture is 9 atomic % to 35 atomic % inclusive. With this, the hole injection layer has improved flatness as compared to a hole injection layer made only of tungsten oxide, so that smoothness and film thickness uniformity of an adjoining organic layer are also improved.

Thus, it is possible to inhibit formation of pinholes in the hole injection layer due to a protruding portion on the hole injection layer and so on and also to inhibit generation of variation in film thickness.

In addition, compared to the hole injection layer made of molybdenum oxide, the hole injection layer according to the aspect of the present invention has low solubility in an aqueous solution and so on; thus, even in the case of using the aqueous solution in a process for forming an upper layer on the hole injection layer, it is possible to inhibit decrease in film thickness due to the elution of the hole injection layer, which is caused by the aqueous solution after the formation of the hole injection layer.

Accordingly, with the hole injection layer according to the aspect of the present invention, generation of pinholes is avoided, thus making it possible to further reduce an optimal film thickness of the hole injection layer. With this, it is possible to achieve an organic EL element requiring a low drive voltage and having high luminance efficiency, thereby facilitating manufacturing of a large scale organic EL panel and the mass production thereof.

In addition, an optimal thickness of the hole injection layer is approximately 100 nm, for example, in terms of injection characteristics, light transmissivity, and so on. However, when the Applicants formed the hole injection layer having a composition in which a content rate of molybdenum element with respect to a metal element in the mixture was over 35 atomic %, and when an aqueous solution was used in the process of forming an upper layer on the hole injection layer having a thickness of 100 nm, the entire hole injection layer was completely eluted by the aqueous solution, resulting in a failure to form the hole injection layer.

Accordingly, by setting a content rate of the molybdenum element with respect to the metal element in the mixture to 9 atomic % to 35 atomic % inclusive, it is possible to inhibit generation of pinholes in the hole injection layer and its adjoining organic layer, and also to avoid a significant decrease in film thickness due to the elution of the hole injection layer after the formation thereof even in the case of using an aqueous solution in the process for forming an upper layer on the hole injection layer.

In addition, an organic electroluminescence element according to another aspect of the present invention is the organic electroluminescence element, in which a content rate of the molybdenum element with respect to a metal element in the mixture is from approximately 9 atomic % to approximately 12 atomic %, inclusive.

According to the aspect of the present invention, it is possible to inhibit elution and also to achieve a hole injection layer having preferable surface roughness, and to thereby achieve an organic EL element requiring a very low drive voltage and having high luminance efficiency, thus making it possible to facilitate manufacturing of a large scale organic EL panel and the mass production thereof.

In order to achieve an organic EL element requiring a lower drive voltage, it is preferable that the hole injection layer have reliable hole injection performance while having, at the same time, smaller film thickness. To achieve this, the film thickness of the hole injection layer at the time of film formation should be equivalent to a film thickness that is obtained by adding, to a film thickness that should finally be ensured, an amount of film erosion of the hole injection layer which is subsequently caused by the aqueous solution. However, the larger the amount of the film erosion caused by the aqueous solution is, the more variation the film thickness of the hole injection layer that is finally ensured has, thus causing decreases in luminance accuracy and luminance efficiency. Based on the consideration above, in order to achieve the organic EL element requiring a lower drive voltage, it is preferable that the film thickness be smaller at the time of film formation and that the amount of film erosion also be smaller.

On the other hand, the surface roughness of the formed hole injection layer tended to converge on approximately 10 nm that was a lower limit for increasing the content rate of the molybdenum element with respect to the metal element in the mixture. With this, a critical condition for the film thickness of the hole injection layer for inhibiting generation of pinholes in the hole injection layer and achieving a low drive voltage is that a film thickness equal to or larger than the surface roughness is ensured at the point when the hole injection layer is formed.

Furthermore, in the above condition in which the ensured film thickness is at least equal to or larger than the surface roughness at the completion of the film formation of the hole injection layer, a condition for not generating pinholes even when film erosion is caused in the hole injection layer by the aqueous solution after the process of forming the upper layer on the hole injection layer is to constrain the film erosion caused by the aqueous solution as described above to around the level of the surface roughness described above.

A condition for the hole injection layer to satisfy the conditions described above is that the content rate of the molybdenum element is 9 atomic % to 12 atomic % inclusive. When the content rate of the molybdenum element is 12 atomic %, the surface roughness of the hole injection layer is approximately 12 nm at the completion of the film formation, and the amount of film erosion of the hole injection layer due to the aqueous solution is approximately 12 nm; this serves as a critical condition for the molybdenum doping concentration for allowing the film of the hole injection layer to exist as described above.

In addition, an organic electroluminescence element according to another aspect of the present invention is the organic electroluminescence element, in which a surface roughness Rmax of the hole injection layer is from approximately 10 nm to approximately 20 nm, inclusive.

According to the aspect of the present invention, the flatness of the hole injection layer thus ensured prevents occurrence of a short circuit caused by the pinholes in the organic luminescent layer, thereby allowing avoiding decrease in luminance efficiency of the organic EL element and decrease in the manufacturing yield of the organic EL panel.

In addition, an organic electroluminescence element according to another aspect of the present invention is the organic electroluminescence element, in which the organic luminescent layer is composed primarily of a polymer organic material.

According to the aspect of the present invention, even in the case of using an aqueous solution in the process of patterning a bank for separately forming a polymeric organic material, it is possible to inhibit decrease in film thickness due to the elution of the hole injection layer into the aqueous solution because the hole injection layer is made of a mixture of molybdenum oxide and tungsten oxide.

In addition, an organic electroluminescence element according to another aspect of the present invention is the organic electroluminescence element, in which the hole injection layer is formed by a sputtering film forming method.

According to the aspect of the present invention, the hole injection layer contains the molybdenum element having an accurately-adjusted composition ratio which is a content rate of 9 atomic % to 35 atomic % inclusive, and also has excellent film flatness without further crystallization.

In addition, an organic electroluminescence element according to another aspect of the present invention is the organic electroluminescence element, in which the hole injection layer is formed by the sputtering film forming method, using a sputtering target containing molybdenum and tungsten at an atomic ratio of between approximately 65:35 and approximately 20:80.

According to the aspect of the present invention, it is possible to set, more accurately, a desired ratio as a molybdenum-tungsten atomic ratio of the hole injection layer formed by the sputtering film forming method, and to obtain a necessary hole injection amount.

It is preferable that the sputtering target be set to contain the molybdenum oxide and the tungsten oxide at an atomic ratio between 65:35 and 20:80. When the sputtering target contains molybdenum oxide and tungsten oxide at an atomic ratio of 65:35, the hole injection layer contains molybdenum oxide at a content rate of, for example, approximately 35 atomic %. In addition, when the sputtering target contains molybdenum oxide and tungsten oxide at an atomic ratio of 20:80, the hole injection layer that is formed contains molybdenum oxide at a content rate of approximately 9 to 10 atomic %, for example.

With this, it is possible to set, more accurately, a desired ratio as the molybdenum-tungsten atomic ratio of the hole injection layer formed by the sputtering film forming method, and to obtain a necessary hole injection amount.

In addition, an organic electroluminescence element according to another aspect of the present invention is the organic electroluminescence element, in which the anode is formed by the sputtering film forming method.

According to the aspect of the present invention, in the organic electroluminescence element, the anode and the hole injection layer adjoining each other are formed by the sputtering film forming method, thus allowing both layers to be formed in the same vacuum chamber. Accordingly, this allows simplification of the manufacturing process and achieves a low-cost organic electroluminescence element.

Furthermore, since the hole injection layer is formed on the anode the surface of which remains in a clean state, it is possible to achieve an organic electroluminescence element having excellent properties and having no physical barriers such as a surface oxide layer.

In addition, an organic electroluminescence element according to another aspect of the present invention is the organic electroluminescence element, in which the anode, the organic luminescent layer, and the cathode are stacked on a substrate in order, and the anode contains at least one of Ag and Al, and the cathode is transparent.

According to the aspect of the present invention, the anode including at least one of Ag and Al has high reflectivity, thereby allowing a top-emission structure which is appropriate for forming an active-matrix organic EL element which excels in luminescence property.

In addition, a display panel device according to another aspect of the present invention includes the organic electroluminescence element.

According to the aspect of the present invention, the present invention can not only be realized as an organic electroluminescence (hereinafter, EL) element having the characteristics described above but can also achieve the same structure and effects, as a display panel device including such an organic EL element.

In addition, a display apparatus according to another aspect of the present invention includes the display panel apparatus.

According to the aspect of the present invention, the present invention can not only be realized as an organic EL element having the characteristics described above but can also achieve the same structure and effects, as a display panel apparatus including such an organic EL element.

In addition, an organic electroluminescence illumination source according to another aspect of the present invention includes the organic electroluminescence element.

According to the aspect of the present invention, it is possible to realize the same effect, as an illumination source including an organic EL element having the characteristics as described above.

In addition, a method for manufacturing an organic electroluminescence element according to another aspect of the present invention includes: forming an anode on a substrate; stacking an oxide layer on the anode by a sputtering film forming method, the oxide layer being made of a mixture of molybdenum oxide and tungsten oxide; stacking an organic luminescent layer on the oxide layer, the organic luminescent layer being composed primarily of an organic luminescent material; and forming a cathode on an upper layer provided on the organic luminescent layer, and a content rate of a molybdenum element with respect to a metal element in the mixture is from 9 atomic % to 35 atomic % inclusive.

According to the aspect of the present invention, it is possible to form a hole injection layer made of a mixture of molybdenum oxide and tungsten oxide and containing the molybdenum element at a content rate of 9 atomic % to 35 atomic % inclusive with respect to the metal element in the mixture. With this, the flatness of the hole injection layer is improved as compared to the hole injection layer made only of tungsten oxide. Furthermore, compared to the hole injection layer made of the molybdenum oxide having solubility in an aqueous solution, it is possible to avoid decrease in the film thickness of the hole injection layer after the formation thereof due to the elution of the hole injection layer caused by the aqueous solution, even in the case of using an aqueous solution in the process for forming an upper layer on the hole injection layer.

Accordingly, it is possible to prevent generation of pinholes in the hole injection layer and the organic luminescent layer, and to thereby allow a hole injection layer and an organic layer to have uniform film thickness. With this, it is possible to achieve an organic EL element requiring a low drive voltage and having high luminance efficiency, thus making it possible to facilitate manufacturing of a large scale organic EL panel and the mass production thereof.

Note that in spite of an attempt by the Applicants to form a mixed film containing the molybdenum element at a content rate of below 9 atomic % with respect to the metal element in the mixture, it was difficult to form a film having a stable element ratio.

In addition, a preferable thickness of the hole injection layer is up to approximately 100 nm, for example, in terms of injection characteristics, light transmissivity, and so on. However, the Applicants failed to form the hole injection layer when forming the hole injection layer containing the molybdenum element at a composition ratio of over 35 atomic % with respect to the metal element in the mixture, and when using an aqueous solution in the process of forming an upper layer on the hole injection layer having a thickness of 100 nm, the entire hole injection layer was completely eluted by the aqueous solution, resulting in a failure to form the hole injection layer.

Accordingly, by forming the hole injection layer which contains the molybdenum element at a content rate of 9 atomic % to 35 atomic % inclusive with respect to the metal element in the mixture, it is possible to inhibit generation of pinholes in the organic layers provided over and under the hole injection layer, and also to avoid a significant decrease in film thickness caused by the elution of the hole injection layer after the formation thereof even in the case of using an aqueous solution in the process for forming an upper layer on the hole injection layer.

In addition, a method for manufacturing an organic electroluminescence element according to another aspect of the present invention is the method for manufacturing an organic electroluminescence element, in which in the stacking of an oxide layer, the sputtering film forming method is performed using a sputtering target containing molybdenum and tungsten at an atomic ratio of between approximately 65:35 and approximately 20:80.

According to the aspect of the present invention, the hole injection layer, which is made of a mixture of molybdenum oxide and tungsten oxide and formed using a sputtering target having a molybdenum-tungsten atomic ratio of 65:35, contains the molybdenum element at a content rate of 35 atomic % with respect to the metal element in the hole injection layer; thus, the content rate of the molybdenum element in the hole injection layer can be set to 35 atomic % or less by setting the molybdenum ratio of the sputtering target to a level not higher than this level.

In addition, the hole injection layer, which is made of a mixture of molybdenum oxide and tungsten oxide and formed using a sputtering target having a molybdenum-tungsten atomic ratio of 20:80, contains the molybdenum element at a content rate of 9 atomic % with respect to the metal element in the hole injection layer; thus, the content rate of the molybdenum element in the hole injection layer can be set to 9 atomic % or more by setting the molybdenum ratio in the sputtering target to a level not lower than this level.

For the reasons described above, by using the sputtering target according to the aspect of the present invention, it is possible to achieve a desired atomic ratio of molybdenum to tungsten in the hole injection layer formed by the sputtering film forming method, and to thereby obtain a necessary hole injection amount.

In addition, a method for manufacturing an organic electroluminescence element according to another aspect of the present invention is the method for manufacturing an organic electroluminescence element, in which in the forming of an anode, the anode is formed by the sputtering film forming method.

According to the aspect of the present invention, in the organic electroluminescence element, the anode and the hole injection layer adjoining each other are formed by the sputtering film forming method, thus allowing both layers to be formed in the same vacuum chamber. Accordingly, this allows simplification of the manufacturing process and achieves a low-cost organic electroluminescence element.

Furthermore, since the hole injection layer is formed on the anode the surface of which remains in a clean state, it is possible to achieve an organic electroluminescence element having excellent properties and not having physical barriers such as a surface oxide layer.

In addition, a method for manufacturing an organic electroluminescence element according to another aspect of the present invention is the method for manufacturing an organic electroluminescence element, in which in the stacking of an organic luminescent layer, the organic luminescent layer is stacked by a wet film forming method.

According to the aspect of the present invention, since organic luminescent layers are stacked by the wet film forming method, it is possible to stack organic luminescent layers having uniform film thickness in larger area at low costs.

Hereinafter, an embodiment of the present invention will be described with reference to the drawings.

In the drawings below, for simplification of the description, the same numerical reference is assigned to a constituent element which substantially has the same function. Note that the present invention is not limited to the embodiment below.

An organic EL element 1 according to the embodiment of the present invention will be described with reference to FIG. 1. FIG. 1 is a structural cross-sectional diagram of an active-matrix organic EL element according to the embodiment of the present invention. The organic EL element 1 shown in the figure includes: a substrate 40, a transistor element 50 (50A, 50B) formed on the substrate 40, and an organic electroluminescence (organic EL) portion 60 which is formed thereon.

The substrate 40 is, for example, a glass substrate. In addition, for the substrate 40, it is also possible to use a flexible substrate made of resin. Several layers are stacked on the substrate 40, and the substrate 40 and the layers make up a TFT substrate 10 shown in FIGS. 2 and 3.

The transistor element 50 formed on the substrate 40 is a thin-film transistor (TFT). The transistor element 50 includes: a source-drain electrode 51, a semiconductor layer 52 formed in contact with the source-drain electrode 51, and a gate insulator 53. On the gate insulator 53, a gate electrode 54 is formed. The TFT 50A and TFT 50B in this example are electrically connected with each other via wiring 55. With this structure, the organic EL element 1 has an active-matrix structure.

On the substrate 40, a planarizing film 57 is formed covering the transistor element 50. The planarizing film 57 ensures flatness of an upper surface thereon. The substrate 40, the transistor element 50, and the planarizing film 57 make up the TFT substrate 10 that is a substrate structure.

On the TFT substrate 10 including the planarizing film 57, the organic electroluminescence (organic EL) portion 60 is formed. The organic EL portion 60 includes: an anode 12, a hole injection layer 13, an interlayer 14, an organic luminescent layer 15, a bank layer 16, an electron injection layer 18, and a transparent cathode 20.

The organic EL element 1 shown in FIG. 1 has a top emission structure. To be specific, when a voltage is applied to the organic EL portion 60, light is generated in the organic luminescent layer 15, and light 70 exits (upward) through the transparent cathode 20 and a transparent sealing film 22. In addition, part of the light generated in the organic luminescent layer 15, which has traveled toward a TFT board 10 side, is reflected by the anode 12 and the light 70 exits (upward) through the transparent cathode 20 and the transparent sealing film 22.

In the top emission structure, the light 70 is emitted upward by providing the anode 12 on the TFT substrate 10 side as a reflecting electrode, and providing the transparent cathode 20 facing the anode 12 and the transparent sealing film 22 as transparent. Therefore, light reflectivity of the anode 12 is as important an element as luminance efficiency of the organic luminescent layer 15.

The organic EL element 1 having a top emission structure has an advantage over an organic EL element having a general bottom emission structure in that the organic EL element 1 allows increase in luminance-area ratio. A larger luminance-area ratio allows lower luminance (for obtaining a given amount of light) and lower voltage, thus producing an advantage of increasing lifetime. The reason for the larger luminance-area ratio of the top emission structure is that the TFT substrate 10 including the transistor element 50 is provided under the organic EL portion 60 so that the light 70 is extracted in a direction opposite to the TFT substrate 10. With this, it is possible to avoid the problem of the luminance-area ratio even when spaces on the TFT substrate 10 are occupied by the transistor element 50 and a capacitor. Note that in the case of the top emission structure, the substrate 40 need not be transparent, and thus it is also possible to use a nontransparent substrate, for example, a silicone substrate.

The anode 12 is an electrode stacked on a surface of the TFT board 10 and applies a positive voltage to the transparent cathode 20 in the organic EL element 1. The anode 12 requires light reflectivity in addition to conductivity. Higher light reflectivity allows better reflection of the light generated in the organic luminescent layer 10, thus improving the luminance efficiency of the organic EL element 1. It is preferable that the anode material used for the anode 12 be, for example, Al or Ag having high reflectively, or an alloy thereof. In addition, the anode 12 has a thickness of 100 to 300 nm, for example. In addition, it is preferable that the anode 12 be formed by the sputtering film forming method, along with the hole injection layer 13 which will be described later. With this, it is possible to sequentially form the anode 12 and the hole injection layer 13 in the same vacuum chamber, thus allowing simplification of the manufacturing process.

Furthermore, since the hole injection layer is formed on the anode the surface of which remains in a clean state, it is possible to achieve an organic electroluminescence element having excellent properties and having no physical barriers such as a surface oxide layer.

According to the present embodiment, the anode including at least one of Ag and Al has high reflectivity, thereby allowing a top-emission structure which is appropriate for forming an active-matrix organic EL element which excels in luminescence property.

The hole injection layer 13, which is formed on the surface of the anode 12, has a function to stabilize holes or support generation of the holes, and to inject the holes into the organic luminescent layer 15. With this, the organic EL element 1 requires a lower drive voltage, and such stabilization of the hole injection increases the lifetime of the element.

In addition, the hole injection layer 13 requires light transmissivity and surface flatness in addition to the hole injection performance.

The light transmissivity of the hole injection layer 13 is necessary for transmitting the light generated in the organic luminescent layer 15 toward the anode 12, and transmitting the light reflected from the anode 12 toward the transparent cathode 20 without loss. Accordingly, the luminance efficiency of the organic EL element 1 is increased due to improved light transmissivity of the hole injection layer 13. It is preferable that the film thickness of the hole injection layer 13 be approximately 10 nm to 100 nm, for example, because the reflectivity decreases as the film thickness of the hole injection layer 13 increases. Note that it is preferable that in order to secure sufficient reflectivity, the light reflectivity (visible light range) of a film stack that is provided between the anode 12 and the hole injection layer 13 be 80% or more.

On the other hand, the surface flatness of the hole injection layer 13 ensures that the organic luminescent layer 15 (or the interlayer 14) formed on the hole injection layer 13 is flat and uniform. Since this inhibits the organic luminescent layer 15 from having thickness variation within a pixel, it is possible to prevent non-uniformity of an electromagnetic field between both electrodes and acceleration of deterioration, in-pixel local luminance, and short circuit which are caused thereby.

Note that the structure and the material of the hole injection layer 13 will be described later with reference to an organic EL element shown in FIG. 2.

The interlayer 14, formed on the surface of the hole injection layer 13, has a function as a hole transport layer which efficiently transports the holes injected from the hole injection layer 13 into the organic luminescent layer 15, prevents excitons from becoming deactivated on a boundary between the organic luminescent layer 15 and the hole injection layer 13, and further blocks electrons. For the interlayer 14, it is possible to use an organic material having hole transportability. The organic material having hole transportability is an organic substance having a property to transmit generated holes by intermolecular charge-transfer reaction. This is also referred to as a p-type organic semiconductor.

The interlayer 14 may be made of a polymeric material or a low-molecular material, but it is preferable that the film be formed by the wet film forming method. It is further preferable that the interlayer 14 be made of a polymeric material having hole transportability, for example, triphenylamine and polyaniline. The thickness of the interlayer 14 is approximately 5 to 50 nm, for example. In addition, in forming the organic luminescent layer 15 that is an upper layer, it is preferable that such material contain a linker so as to prevent elution.

For the wet film forming method for forming the interlayer 14, a jet nozzle method represented by the ink-jet method or a dispenser method can be used although no particular restriction is provided. In this case, the ink-jet method is to form the interlayer 14 by squirting ink, which is made of an organic film-forming material, out of a nozzle onto the surface of the hole injection layer, so as to form the interlayer 14.

Note that in some cases the interlayer 14 is omitted depending on the material used for the hole injection layer 13 and the organic luminescent layer 15 adjoining the interlayer 14.

The organic luminescent layer 15, which is formed on the surface of the interlayer 14, has a function to produce luminescence when an excited state is generated by the injection and reunion of holes and electrons.

For the organic luminescent layer 15, it is preferable to use a luminescent organic substance that allows forming a film by the wet film forming method such as the ink-jet method or a spin coating method. With this, it is possible to form a uniform film onto a large-screen substrate in a simple manner. For the material, a polymeric organic material is preferable although no particular restriction is provided for the material. As characteristics of the polymeric organic material, it is possible to give: simple device structure, excellent reliability of the film, and low voltage for driving the element.

A polymer having a conjugation such as an aromatic ring or a condensed ring, or a n-conjugated polymer has fluorescence and thus can be used as the polymeric organic material for forming the organic luminescent layer 15. As a polymeric luminescence material for forming the organic luminescent layer 15, it is possible to give, for example, polyphenylene vinylene (PPV) or a derivative thereof (PPV derivative), polyfluorene (PFO) or a derivative thereof (PFO derivative), and a polyspirofluorene derivative. In addition, it is also possible to use polythiophene and a derivative thereof.

In addition, even when using an aqueous solution in the process for patterning the bank for separately forming the polymeric organic material, it is possible to inhibit decrease in film thickness due to elution of the hole injection layer into the aqueous solution because the hole injection layer is formed using a mixture of molybdenum oxide and tungsten oxide.

The bank layer 16, which is formed on the surface of the hole injection layer 13, has a function as the bank for forming the interlayer 14 and the organic luminescent layer 15 which are formed by the wet film forming method in a predetermined region.

For the bank layer 16, a water-repellent substance having resistivity $10^5$ Ωcm or more is used although no particular restriction is provided. A material having resistivity $10^5$ Ωcm or less causes a leakage current between the anode and the cathode or a leakage current between adjoining pixels, causing various problems such as increase in consumption power. In addition, when using a hydrophilic substance for the bank 16, the surface of the hole injection layer 13, which is generally hydrophilic, has smaller difference from the surfaces of the bank layer 16 and the hole injection layer 13 in terms of hydrophilic-hydrophobic properties. If this is the case, it is difficult to selectively hold, in an opening portion, the ink including an organic substance that is a constituent element of the interlayer 14 and the organic luminescent layer 15.

The material used for the bank layer 16 may be an inorganic substance or an organic substance, but generally the organic substance has higher water repellency and thus can be preferably used. As an example of such a material, resin such as polyimide and polyacryl can be given. For better water repellency, fluorine may also be introduced.

To form a portion that effectively operates as part of an organic EL element, it is essential that the bank layer 16 be patterned into a predetermined shape and have at least one opening portion. For the patterning method, it is preferable to adapt a photolithography method using a photosensitive material although no particular restriction is provided. The thickness of the bank layer 16 is approximately 100 to 3000 nm, for example.

The electron injection layer 18, which is formed on the organic luminescent layer 15, has a function to reduce a barrier to injection of electrons into the organic luminescent layer 15 so as to decrease the drive voltage for the organic EL element 1 and prevents excitons from becoming deactivated. With this, it is possible to stabilize the electron injection and increase the lifetime of the element, and to decrease defects of the element by reinforcing the adhesion with the transparent cathode 20 and thereby improving uniformity of the luminescent surface.

The electron injection layer 18 is preferably made of barium, aluminum, phthalocyanine, lithium fluoride, and barium-aluminum laminate although no particular restriction is provided. The thickness of the electron injection layer 18 is approximately 2 to 50 nm, for example.

The transparent cathode 20, which is stacked on the electron injection layer 18, has a function to apply a negative voltage to the anode 12 of the organic EL element 1 so as to inject electrons into the element (particularly, the organic luminescent layer 15).

For the transparent cathode 20, it is preferable to use a substance or a structure having high transmissivity although no particular restriction is provided. With this, it is possible to achieve a top-emission organic EL element having high luminance efficiency.

For structuring the transparent cathode, a metal-oxide layer is used although no particular restriction is provided. For the metal-oxide layer, a layer made of indium tin oxide (hereinafter, described as ITO) or indium zinc oxide (hereinafter, described as IZO) is used although no particular restriction is provided. In addition, the thickness of the transparent cathode 20 is approximately 5 to 200 nm, for example.

The transparent sealing film 22, which is formed on the transparent cathode 20, has a function to protect the element from water. If the transparent sealing film 22 is not formed, the water accelerates separation between the electrode and the organic layer and so on, causing a dot-shaped or circular non-luminescent defect called dark spot (dark defect) to grow. The transparent sealing film 22 needs to be transparent. The transparent sealing film 22 is made of SiN, SiON, or an organic film, for example. In addition, the thickness of the transparent sealing film 22 is approximately 20 to 5000 nm, for example.

Figure 2:
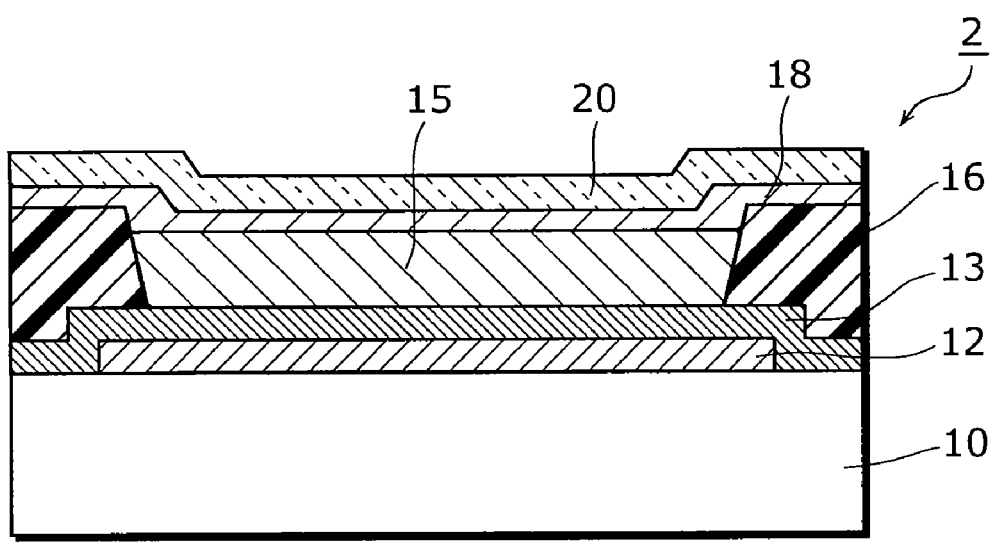
FIG. 2 is a structural cross-sectional diagram of an organic EL element according to the embodiment of the present invention.

FIG. 2 is a structural cross-sectional diagram of an organic EL element according to an embodiment of the present invention. An organic EL element 2 shown in the figure includes: the TFT substrate 10, the anode 12, the hole injection layer 13, the organic luminescent layer 15, the bank layer 16, the electron injection layer 18, and the transparent cathode 20. Compared to the active-matrix organic EL element 1 shown in FIG. 1, the organic EL element 2 shown in FIG. 2 is different only in the structure of the TFT substrate 10 and in that the interlayer 14 and the transparent sealing film 22 are omitted.

Here, the structure and the material of the hole injection layer 13 that are characteristics of the present invention will particularly be described.

For the hole injection layer 13 used for the organic EL element 2, it is preferable that an ionization potential (Ip) of the hole injection layer 13 be located between the ionization potentials of the adjoining anode 12 and the organic luminescent layer 15 (the interlayer 14 in the case where the interlayer 14 is present). With this, it is possible to reduce the barrier to the hole injection from the anode 12 into the organic luminescent layer 15 (or the interlayer 14), and to reduce the drive voltage.

Conventionally, as a compatible material, a polymeric organic material represented by PEDOT is often used for the hole injection layer. However, when forming an organic EL element using a hole injection layer made of PEDOT, the deterioration of the device is accelerated by diffusion of sulfonic acid into the adjoining organic layer. In addition, a water-soluble conductive material represented by the PEDOT solution is generally acidic solution and has a problem of causing corrosion to equipment such as the ink-jet nozzle. In addition, the material is not a complete solution but is made of diffused fine particles, thus causing a problem of clogging the ink-jet nozzle. Furthermore, its conductivity which is too high increases a leakage current when even a portion of this film contacts the cathode.

To solve the problems described above, a mixture of molybdenum oxide (MoOX) and tungsten oxide (WOx) which are transition metal oxides is applied.

The reason for applying such materials as molybdenum oxide (MoOx) and tungsten oxide (WOx) is that these metal oxides each have a large work function and excellent hole injection performance. Tungsten oxide has an Ip of 5.5 eV, and molybdenum oxide has an Ip of 5.6 ev, both having Ips higher than those of other metal oxide materials $Ag_2$ (Ip=4.6 ev), CuOx, TiOx, ZnOx, RuOx, and VOx each of which has an Ip lower than 5.0 V. In addition, the two have higher Ips than an Ip of the PEDOT.

In addition, as the method for manufacturing the hole injection layer 13 made of the mixture of the oxides described above, the sputtering film forming method is more preferable than the deposition film forming method which requires higher deposition temperature, in terms of increasing size and the mass production.

In terms of surface flatness, it is preferable that the hole injection layer 13 according to the present embodiment contain molybdenum at a content rate of 9 atomic % or more. Here, the content rate of molybdenum is a ratio of molybdenum atoms with respect to a total sum of the molybdenum atoms and tungsten atoms that exist in the hole injection layer 13.

Figure 3:
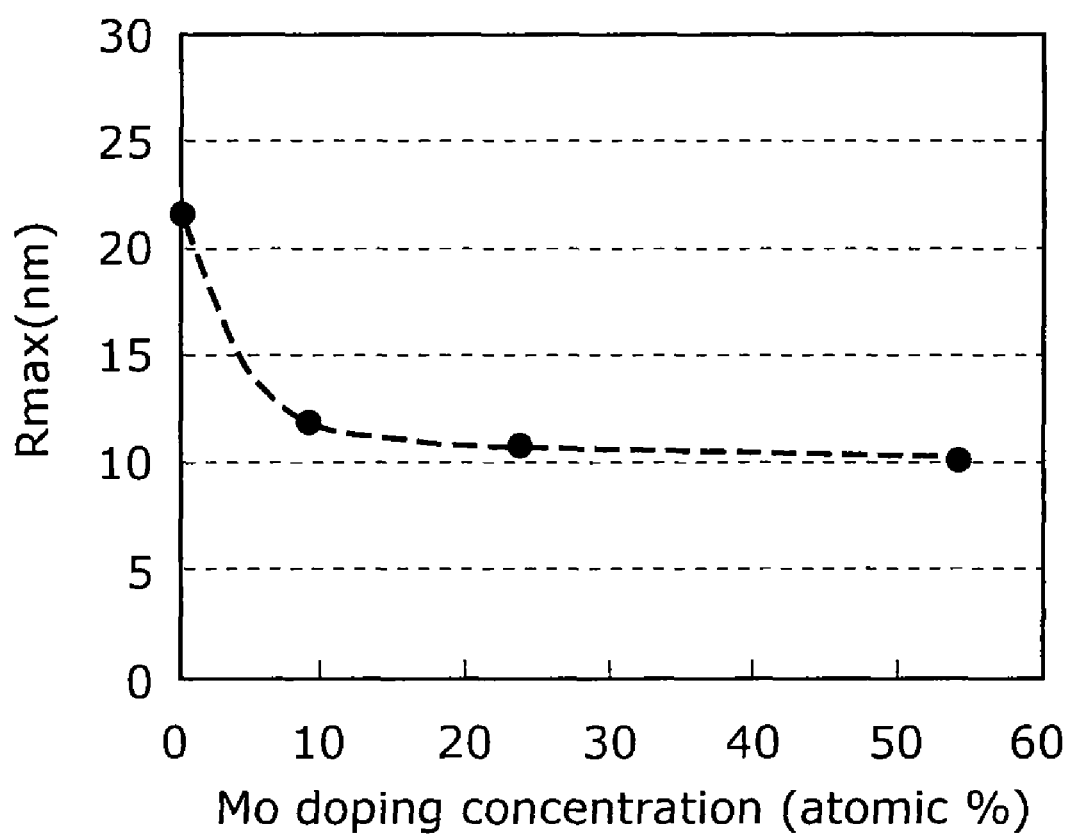
FIG. 3 is a graph showing surface roughness of a hole injection layer in relation to molybdenum doping concentration.

FIG. 3 is a graph showing surface roughness of the hole injection layer in relation to the molybdenum doping concentration. The horizontal axis represents molybdenum (Mo) doping concentration (atomic %) and the vertical axis represents surface roughness Rmax (nm). Here, the molybdenum doping concentration is equivalent to the content rate of molybdenum described above. The content rate of Mo (atomic %) in the present embodiment is a concentration equivalent which is calculated by XPS, and is a ratio of Mo atoms with respect to the total amount of W and Mo atoms. In addition, the surface roughness Rmax is a maximum difference from an average height of uneven surfaces. In addition, the film made of a mixture of tungsten oxide and molybdenum oxide used for evaluating surface flatness is formed on a flat ITO substrate (a glass substrate on which an ITO film is formed) by the sputtering film forming method. The film thickness is 50 nm. In addition, the sputtering film forming condition is an output of 250 W (Ar flow 100 SCCM/$O_2$ flow 100 SCCM, gas pressure 4.5 Pa). As the figure shows, when the hole injection layer is made only of tungsten oxide (Mo doping 0 atomic %), and when the Mo doping concentration is low, the surface roughness Rmax is large, so that the surface flatness of the hole injection layer deteriorates.

On the other hand, considering that the appropriate thickness of the interlayer 14 is around 20 nm, it is preferable that the surface roughness Rmax of the hole injection layer 13 be 20 nm or less. When the surface roughness Rmax exceeds 20 nm, an electric short circuit occurs in the interlayer 14, causing decrease in manufacturing yield.

It is proved that the appropriate surface roughness Rmax of the hole injection layer 13 is 20 nm or less and that the appropriate content rate of molybdenum in the hole injection layer 13 is 9 atomic % or more, based on the dependency of the surface roughness Rmax on the Mo doping concentration as shown in FIG. 3.

According to the aspect of the present invention, the flatness of the hole injection layer thus ensured prevents occurrence of a short circuit caused by the pinholes in the organic luminescence layer, thereby allowing avoiding decrease in luminance efficiency of the organic EL element and decrease in the manufacturing yield of the organic EL panel.

Note that in spite of an attempt to form a mixed film which contains molybdenum in the hole injection layer 13 at an appropriate content rate of below 9 atomic %, it was difficult to form a film having a stable elemental ratio.

Figure 4A:
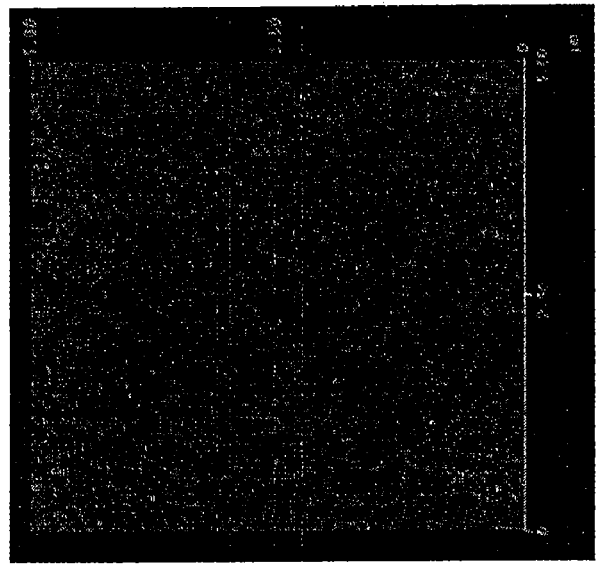
FIG. 4A is a surface AFM image of the hole injection layer in the case where the molybdenum doping concentration is 0 atomic %.
Figure 4B:
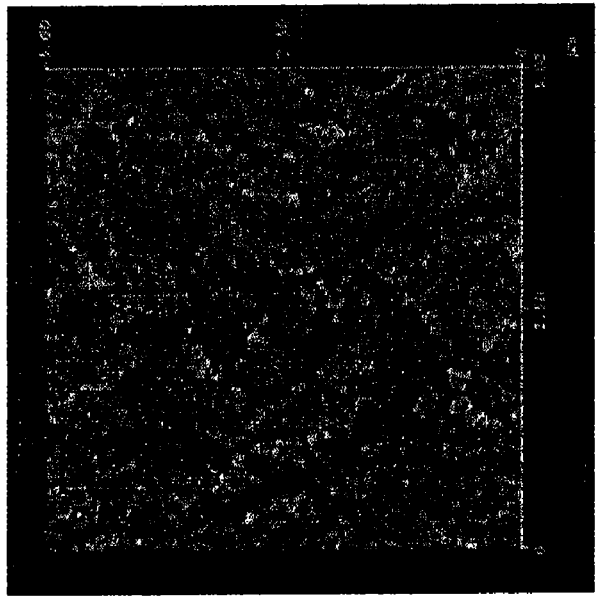
FIG. 4B is a surface AFM image of the hole injection layer in the case where the molybdenum doping concentration is 9 atomic %.

FIGS. 4A and 4B show, respectively, surface atomic force microscope (AFM) images of the hole injection layer where the molybdenum doping concentration is 0 atomic % and where the molybdenum doping concentration is 9 atomic %. FIGS. 4A and 4B show that the hole injection layer having a molybdenum doping concentration of 0 atomic % has larger crystal grains and larger image shading difference and is thus considered to have larger surface unevenness. On the other hand, the hole injection layer having a molybdenum doping concentration of 9 atomic % has larger density and smaller surface unevenness.

The structure in the embodiment of the present invention improves the flatness of the hole injection layer 13 for the reasons below. As the mixing ratio of the molybdenum oxide (or molybdenum) to the tungsten oxide is increased, the crystallinity of the tungsten oxide is further inhibited, so that the hole injection layer 13 approaches an amorphous state. In addition, constituent atoms of an amorphous film formed by the sputtering film forming method are densely arranged at the atomic level, thus improving the surface flatness as compared to the case of high crystallinity. Thus, it can be assumed that the surface flatness improves by increasing the mixing ratio of molybdenum oxide in the hole injection layer.

Note that an approximate surface roughness Ra is 1.5 nm when matching the surface roughness Rmax of 20 nm or less to the surface roughness Ra. Thus, when the surface roughness is evaluated using Ra, it is preferable that Ra be 1.5 or less. Here, the surface roughness Ra is an averaged difference between an average height of uneven surfaces and a height at each point.

As the surface roughness for evaluating the surface flatness of the hole injection layer included in the organic EL element in the present embodiment, Rmax is preferable to Ra. The reason for this is that a largest convex portion in the hole injection layer causes an electrical short circuit between the hole injection layer and its upper layers, that is, the organic luminescent layer and the cathode layer, thus significantly deteriorating a function as a luminescent element in the organic EL element.

Figure 5:
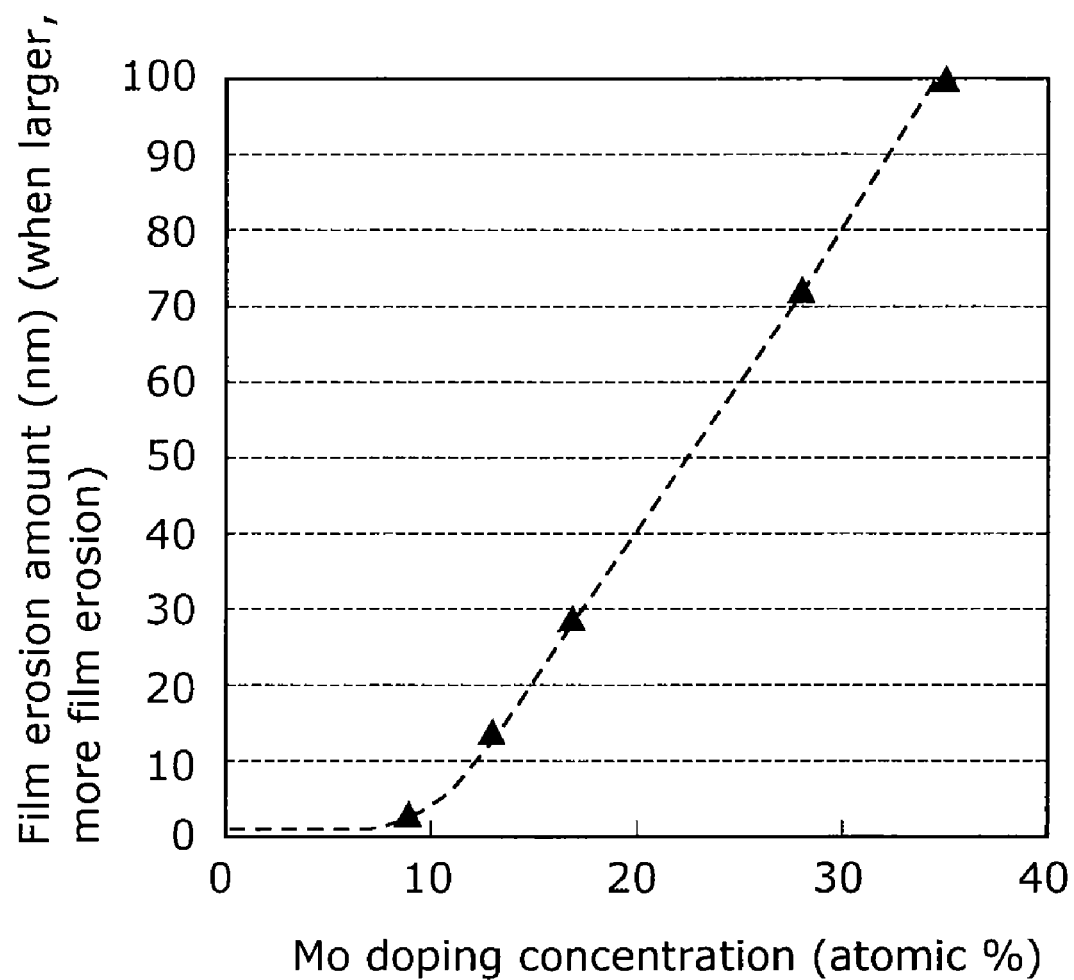
FIG. 5 is a graph showing an amount of film erosion of the hole injection layer caused by aqueous processing, in relation to the molybdenum doping concentration.

FIG. 5 is a graph showing an amount of film erosion of the hole injection layer due to aqueous processing with respect to molybdenum doping concentration. The horizontal axis represents molybdenum (Mo) doping concentration (atomic %), and the vertical axis represents an amount of film erosion due to predetermined aqueous processing. The hole injection layer used here is a mixed film made of tungsten oxide and molybdenum oxide, which is formed under the same condition as the hole injection layer shown in FIG. 3, of which the surface roughness is measured, and has a film thickness of 100 nm. In addition, the predetermined aqueous processing is a process of dipping the film, after annealing the film at 250° C. for 45 minutes, in a 0.2-% tetramethyl ammonium hydroxide (TMAH) aqueous solution for 60 seconds and in pure water for 60 seconds. After the predetermined aqueous processing is performed as above, the amount of film erosion of the mixed film is evaluated. The predetermined aqueous processing is performed under the same condition as in the process used for patterning the bank layer 16 after the film formation of the hole injection layer 13 shown in FIGS. 1 and 2.

As the figure shows, film erosion occurs when the molybdenum doping concentration is around 9 atomic %, and subsequently the amount of film erosion monotonically increases as the molybdenum doping concentration increases. A mixed film which has a molybdenum doping concentration of 35 atomic % and a film thickness of 100 nm is completely stripped.

In terms of injection characteristics and light transmissivity, a preferred range of film thickness of the hole injection layer is approximately 100 nm, for example. However, in the case where the mixed film is formed with a molybdenum doping concentration of over 35 atomic %, even if the hole injection layer has a thickness of 100 nm, the predetermined aqueous processing completely elutes the entire hole injection layer. Molybdenum oxide, which is an oxide having excellent hole injection performance by itself, has hydrophilic property and thus has a possibility of being eluted into the aqueous solution used for patterning the bank layer 16. Thus, when the content amount of molybdenum in the hole injection layer 13 is too high, the film erosion of the hole injection layer 13 is accelerated, resulting in a state in which the anode 12 is not completely shielded from the organic luminescent layer 15.

Thus, by setting the molybdenum doping concentration of the mixed film to 9 atomic % to 35 atomic % inclusive, it is possible to inhibit generation of pinholes in the hole injection layer and the adjoining organic layer, and to avoid a significant decrease in film thickness due to the elution of the hole injection layer 13 caused by an aqueous solution after the formation of the hole injection layer 13 even in the case of using the aqueous solution in a process for patterning the bank layer 16 that is an upper layer on the hole injection layer.

According to this embodiment of the present invention, it is possible to inhibit elution and also to realize a hole injection layer having very satisfactory surface roughness, and to thereby achieve an organic EL element requiring a very low drive voltage and having high luminance efficiency, thus facilitating manufacturing of a large scale organic EL panel and the mass production thereof.

In addition, it is preferable that a lower limit of the film thickness of the hole injection layer 13 made of molybdenum oxide and tungsten oxide be approximately 10 nm. When the film thickness is below this lower limit, there is a higher possibility of generating pinholes in the hole injection layer 13 itself.

Note that it is further preferable that the molybdenum doping concentration of the hole injection layer 13 be from 9 atomic % to 12 atomic % inclusive. The reasons for this will be described below.

In order to achieve an organic EL element requiring a lower drive voltage, it is preferable that the hole injection layer 13 have reliable hole injection performance of the hole injection layer while having, at the same time, smaller film thickness. To achieve this, it is necessary that the film thickness of the hole injection layer 13 at the time of film formation be equivalent to a film thickness that is obtained by adding, to a film thickness that should eventually be ensured, an amount of film erosion of the hole injection layer which is subsequently caused by the aqueous solution used for patterning the bank layer 16. However, the larger the amount of film erosion due to the aqueous solution is, the more variation the film thickness of the ultimately-ensured hole injection layer has, thus causing decreases in luminance accuracy and luminance efficiency. Based on the consideration above, in order to achieve the organic EL element requiring a lower drive voltage, it is preferable that the film thickness be smaller at the time of film formation and that the amount of film erosion also be smaller.

On the other hand, as indicated by the dependency of the surface roughness on the molybdenum doping concentration shown in FIG. 3, the surface roughness of the formed hole injection layer 13 tended to converge on a lower limit of around 10 nm as the molybdenum doping concentration increased. With this, a critical condition for the film thickness of the hole injection layer for inhibiting generation of pinholes in the hole injection layer 13 and achieving a low drive voltage is that a film thickness at least equal to or larger than the surface roughness is ensured at the point when the hole injection layer is formed.

Furthermore, in the above condition in which the ensured film thickness is at least equal to or larger than the surface roughness at the completion of the film formation for the hole injection layer 13, a condition for not generating pinholes even when film erosion is caused in the hole injection layer by the aqueous solution after the process of forming the bank layer 16 that is an upper layer on the hole injection layer is to constrain the film erosion caused by the aqueous solution described above to around the level of the surface roughness described above.

A condition for the hole injection layer 13 to satisfy the conditions described above is that the molybdenum doping concentration is from 9 atomic % to 12 atomic % inclusive. As shown in FIG. 3, when the molybdenum doping concentration is 12 atomic %, the surface roughness of the hole injection layer 13 at the completion of the film formation is approximately 12 nm, whereas as shown in FIG. 5, the amount of film erosion of the hole injection layer 13 caused by the aqueous solution is also around 12 nm. Thus, a critical condition for forming the hole injection layer 13 with a smaller film thickness at the time of film formation and with a smaller amount of film erosion is that the molybdenum doping concentration of the hole injection layer 13 is 12 atomic %.

For example, when the film thickness to be finally ensured for the hole injection layer is 20 nm, the following manufacturing conditions can be assumed: (A) when the molybdenum doping concentration of 12 atomic % is selected as the condition for forming the film of the hole injection layer 13, the film thickness to be finally ensured after the predetermined aqueous processing is set to 20 nm by setting the film thickness at the time of film formation to 32 nm; and (B) when the molybdenum doping concentration of 35 atomic % is selected as the condition for forming the film of the hole injection layer 13, the film thickness to be finally ensured after the predetermined aqueous processing is set to 20 nm by setting the film thickness at the time of film formation to 120 nm.

However, the larger the amount of the film erosion caused by the aqueous solution is, the more variation the finally-ensured film thickness of the hole injection layer has, thus causing decreases in luminance accuracy and luminance efficiency. Thus, the smaller the finally-ensured film thickness of the hole injection layer is, the more significant is the unevenness in film thickness of the hole injection layer caused by the above film erosion, and this is not preferable. From this point, it is preferable to select the manufacturing condition which allows a smaller amount of film erosion due to the predetermined aqueous processing for a smaller film thickness of the hole injection layer that is to be finally be ensured. Therefore, of the above conditions (A) and (B) for manufacturing the hole injection layer, condition (A) is more preferable.

Note that in order to set the molybdenum content rate in the hole injection layer 13 to 9 atomic % to 35 atomic % inclusive by using the sputtering film forming method, it is preferable to set, to between "20/80" and "65/35", for example, the ratio of Mo and W ("Mo/W") contained in the sputtering target used for the sputtering film forming method.

Figure 6:
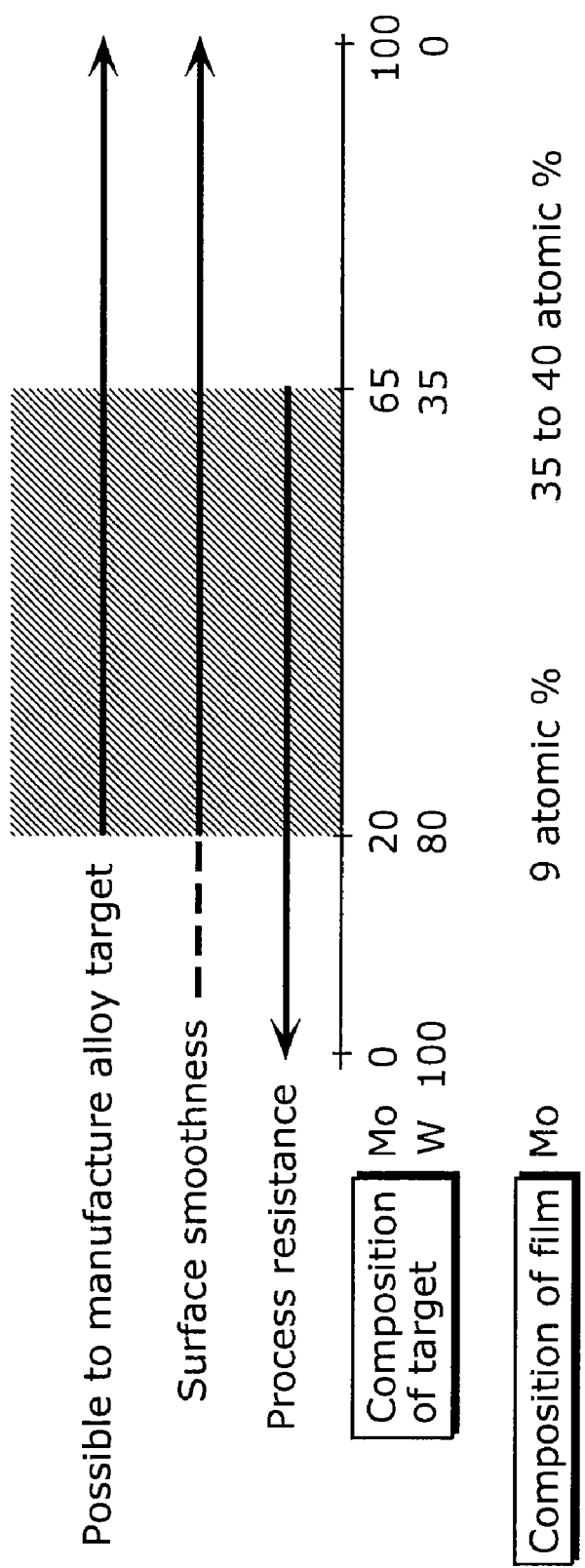
FIG. 6 is a diagram showing a relationship between a composition of a mixed film made of tungsten oxide and molybdenum oxide and a composition of a sputtering target.

FIG. 6 is a diagram showing a relationship between a composition of a mixed film made of tungsten oxide and molybdenum oxide and a composition of the sputtering target. In the case of the sputtering target of Mo/W=20/8, a Mo content rate (Mo/(Mo+W)) is from 9% to 10% inclusive, for example. In addition, in the case of the sputtering target of Mo/W=65/35, the Mo content rate (Mo/Mo+W) is approximately 35%, for example. For the sputtering target, an alloy of Mo and W may also be used, and sputtering targets made of Mo metal and W metal, respectively, may also be used in combination.

It is possible to form the hole injection layer having surface smoothness, process resistance, and a necessary amount of hole injection by setting the ratio of Mo and W ("Mo/W") to between "20/80" and "65/35".

Note that it was impossible to form a sputtering target having a MO ratio of 20% or less, and thus it was difficult to form a mixed film having a molybdenum doping concentration of below 9 atomic %.

As described above, both the tungsten oxide and the molybdenum oxide having hole injection performance have problems of flatness and film erosion when each of them is singly used for the hole injection layer 13.

According to the structure of the present embodiment, it is possible to solve the problems of the film erosion due to processing and the deterioration of flatness at the same time. Thus, it is possible to form a layer having a uniform film thickness, and to obtain a laminate structure having no pinholes. With this, since the non-uniformity of the electromagnetic field between the anode and the cathode, which is caused by in-pixel variation in thickness of the organic luminescent layer, is inhibited, it is possible to inhibit the problems of acceleration of the degradation, local luminance within a pixel, and short circuits which are caused thereby.

Note that the "mixture of molybdenum oxide and tungsten oxide" is typically an oxide formed by oxidation of the mixture of molybdenum (metal) and tungsten (metal). In addition, considering that molybdenum is doped in tungsten oxide, the "mixture of molybdenum oxide and tungsten oxide" may also be referred to as molybdenum-doped oxide tungsten (Mo-doped $WO_x$), or may also be referred to as molybdenum oxide-tungsten oxide ($MoO_x$—$WO_y$) or molybdenum-tungsten oxide ($Mo_{1-x}W_xO_y$). Here, $x$ and $y$ are what are called composition ratios.

Next, the method for manufacturing the organic EL element according to the embodiment of the present invention will be described.

FIGS. 7(a) to 7(k) are process charts describing a method for manufacturing the organic EL element according to the embodiment of the present invention.

Figure 7:
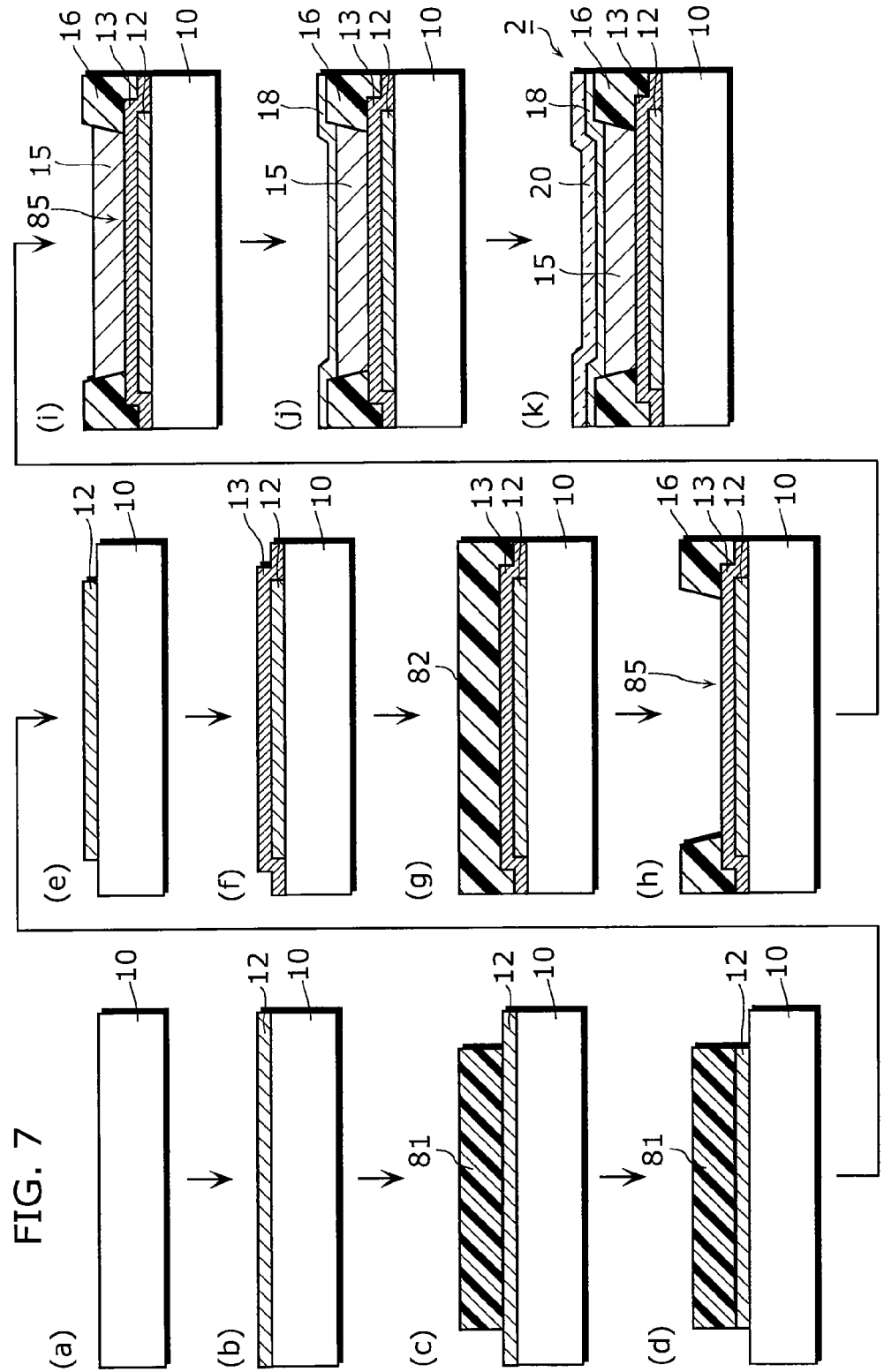
FIGS. 7(a) to 7(k) are a process chart describing a method for manufacturing the organic EL element according to the embodiment of the present invention.

First, as shown in FIG. 7(a), the TFT substrate 10 is prepared. As shown in FIG. 1, the TFT substrate 10 according to the present embodiment is a substrate structure made of the board 40 (for example, glass substrate) on which a TFT 50 and the planarizing film 57 are formed.

Next, on the TFT substrate 10, the anode 12 made of Al or Ag (or an alloy thereof) is formed by the sputtering film forming method (FIG. (b)). Here, the condition for the sputtering film forming method (film forming condition) is to form an Ag alloy target and the TFT substrate 10 in a chamber. Next, after vacuating the inside of the chamber, gasses such as argon (Ar) or nitrogen (N) are introduced, and a voltage is applied between the sputtering target and the substrate. With this, ions are generated and hit the Ag aluminum target, so that target particles are flicked off to adhere to the substrate, so that an Ag alloy film is formed.

Next, a resist mask 81 is formed on the anode 12. The resist mask 81 defines an area (position and shape) in which the anode 12 is to be formed. The resist mask 81 is formed by patterning the anode 12 by the photolithography method after a photoresist is formed on the anode 12 (FIG. 7(c)).

Next, by using the resist mask 81 as a mask, the anode 12 is patterned by wet etching (FIG. 7(d)). Here, the condition for the wet etching is, for example, to dip the in-process element in an acid mixture of phosphoric acid, nitric acid, and acetic acid. With this, the anode 12 is etched.

Next, the resist mask 81 is removed (FIG. 7(e)). To remove the resist mask 81, the in-process element is dipped in acetone, dimethylformamide, or a commercial resist stripping agent. With this, the photoresist is removed. After removing the photoresist, a substrate is washed with isopropyl alcohol (IPA) or pure water. Thus, the process of stripping the photoresist is performed. Note that for the patterning method, etching may also be performed on each layer, other than etching the anode 12 and the hole injection layer 13 collectively.

Next, on the anode 12, the hole injection layer 13 is formed by the sputtering film forming method so as to cover the anode 12 (FIG. 7(f)). Here, the film forming by the sputtering film forming method is as follows. First, for example, a MoW target is placed in the chamber with the in-process element. Next, after vacuating the inside of the chamber, Ar gas and $O_2$ gas are introduced, and a voltage is applied between the sputtering target and the substrate. With this, Ar ions are generated and hit the sputtering target, so that target particles are flicked off to adhere to the substrate, and thus a MoWOx film is formed on the substrate so as to be combined with the $O_2$ during a period of time until they adhere to the substrate or after the adhesion. As described above, the hole injection layer 13 is made of a mixture of molybdenum oxide and tungsten oxide.

Next, the bank layer 16 is formed. First, a photosensitive resin 82 for forming banks is formed on the TFT substrate in such a manner as to cover the hole injection layer 13 (FIG. 7(g)). Next, the photosensitive resin 82 is patterned by the photolithography method via the mask that defines an opening 85 (not shown), so as to form the opening 85 (FIG. 7(h)).

Next, the opening 85 of the bank layer 16 is filled with a material for structuring the organic luminescent layer 15. Here, the organic luminescent layer 15 is formed in a concave portion or a groove portion defined by the bank layer 16 by using the ink-jet method (FIG. 7(i)). In addition, it is possible to form the interlayer 14 along with the organic luminescent layer 15 by using the ink-jet method.

The ink-jet method is a method for forming a film by squirting ink, which is made of a film-forming material, out of a nozzle onto the TFT substrate 10. Note that since the polymer material is patterned with high accuracy, it is preferable to provide the bank layer 16, as described in the present embodiment, in a portion other than the opening portion of the pixel. Furthermore, another method is to control wetness by performing plasma processing on the bank layer 16 and the surface of the hole injection layer 13. After applying the polymer material by the ink-jet method, the organic luminescent layer 15 is obtained by drying.

Next, the electron injection layer 18 is formed on the organic luminescent layer 15 (FIG. 17(j)). The electron injection layer 18 is formed, for example, by the deposition method. Here, the condition for the deposition method is as follows. First, for example, a Ba material is placed in a crucible, which is placed in the chamber with a substrate on which to form a film. Next, after vacuating the inside of the chamber, the Ba is evaporated by heating and adheres to the substrate, so that a Ba film is formed. At this time, the method for heating the crucible is: resistance heating, electron beam, high-frequency induction, and so on.

Next, the transparent cathode 20 is formed on the electron injection layer 18 (FIG. 7(k)). The transparent cathode 20 can be obtained by forming a solid layer on the electron injection layer 18, by the deposition method or the sputtering film forming method. Here, the condition for the deposition method (film forming condition) is as follows. First, for example, an ITO material is placed in a crucible, and the crucible is placed in the chamber with a substrate on which to form a film. Next, after vacuating the inside of the chamber, the ITO is evaporated by heating with an electron beam and adheres to the substrate, so that an ITO film is formed. After this, a predetermined patterning process is performed as necessary.

Lastly, the transparent sealing film 22 is formed on the transparent cathode 20, and thus an organic EL element 1 according to the present embodiment is obtained. The transparent sealing film 22 may be formed by forming the solid layer on the transparent cathode 20 by the sputtering film forming method. Here, for example, the condition for the film forming method (film forming condition) is to place a SiN target in the chamber with a substrate on which to form a film. Next, after vacuating the inside of the chamber, Ar gas is introduced, and a voltage is applied between the SiN target and the substrate. With this, Ar ions are generated and hit the sputtering target, so that target particles are flicked off to adhere to the substrate, so that a SiN film is formed. After this, a predetermined patterning process is performed as necessary. Note that not only wet etching but also dry etching may be used in the patterning.

By the manufacturing method as described above, it is possible to manufacture the organic EL element according to the present embodiment. According to the manufacturing method of the present embodiment, it is possible to form the anode 12 and the hole injection layer 13 by the sputtering film forming method and to form the organic luminescent layer 15 by application or printing method (in this example, the ink-jet method). With this, it is possible to facilitate manufacturing of a large organic EL panel (for example, 100 inch class), and to manufacture the large organic EL panel at the mass production level. In the example described above, the organic luminescent layer 15 is formed using the ink-jet method. However, in the case where the organic luminescent layer 15 can be formed by application or printing, it is possible to use another method (for example, a gravure printing method, a relief printing method, and dispenser). In addition, it is possible to form the organic luminescent layer 15 without using the bank layer 16, depending on the manufacturing method.

In addition, according to the manufacturing method of the present embodiment, the hole injection layer 13 is formed by the sputtering film forming method, using a mixture of molybdenum oxide and tungsten oxide. With this, it is possible to easily ensure flatness of the hole injection layer 13 and also to perform the bank processing while relieving, at the same time, the problem of film erosion of the hole injection layer 13. Thus, it is possible to easily manufacture a large organic EL panel in terms of film flatness and uniformity.

EXAMPLES

Next, surface flatness and reduced film erosion of a hole injection layer, which are the effects produced according to the present invention, will be described with reference to Example and Comparative Examples.

Example 1

In Example 1, the flatness of a molybdenum-doped tungsten oxide film (Mo-doped WOx) having a MO content rate of 23 atomic % was evaluated. The Mo-doped WOx film used for evaluating surface flatness was formed on a flat ITO substrate by the DC sputtering film forming method. The film thickness was 50 nm, and the film forming condition was a 250-W sputtering output (Ar flow 100 SCCM/$O_2$ flow 100 SCCM, gas pressure 4.5 Pa). The film forming temperature was room temperature, and a target-substrate distance was 113 mm.

The surface roughness was Ra=0.81 nm and Rmax=10.89 nm.

Comparative Example 1

In Comparative Example 1, a flatness of a MO-doped WOx film having a MO content rate of 54 atomic % was evaluated. The film forming condition was the same as in Example 1 except for the composition of the sputtering target.

The surface roughness was Ra=0.79 nm and Rmax=10.07 nm.

Comparative Example 2

In Comparative Example 2, a flatness of a film made only of tungsten oxide (having a molybdenum content of 0%) was evaluated. Under the film forming condition of a 250-W sputtering output (Ar flow 100 SCCM/$O_2$ flow 100 SCCM, gas pressure 4.5 Pa), a tungsten oxide (WOx) film was formed by the sputtering method.

The surface roughness was Ra=1.64 nm and Rmax=21.62 nm.

Comparative Example 3

In Comparative Example 3, the film forming condition was changed from that of Comparative Example 1, and the flatness of a tungsten oxide (WOx) film was evaluated. The film forming conditions were the same as those in Comparative Example 1, except for a film forming condition of a 500-W output (gas pressure 4.8 Pa).

The surface roughness was Ra=1.76 nm and Rmax=23.14 nm.

Comparative Example 4

In Comparative Example 4, the film forming condition was changed from that of Comparative Example 1, and the flatness of a tungsten oxide (WOx) film was evaluated. The film forming conditions were the same as those in Comparative Example 1, except for a film forming condition of a 1000-W output (gas pressure 2.7 Pa).

The surface roughness was Ra=1.66 nm and Rmax=20.24 nm.

Comparative Example 5

The flatness of a polyethylenedioxythiophene (PEDOT) film was evaluated.

The surface roughness was Ra=0.82 nm and Rmax=10.90 nm.

Evaluation of Example and Comparative Examples

TABLE 1 summarizes the evaluation results of the surface roughness in Example 1 and the respective Comparative Examples 1 to 5.

TABLE 1

| | Manufacturing method | Sputtering output (W) | Material | Mo content rate | Surface roughness Ra (nm) | Surface roughness Rmax (nm) |
|---|---|---|---|---|---|---|
| Example 1 | Sputtering method | 250 | Mo doping WOx | 23 atomic % | 0.81 | 10.89 |
| Comparative example 1 | Sputtering method | 250 | Mo doping WOx | 54 atomic % | 0.79 | 10.07 |
| Comparative example 2 | Sputtering method | 250 | WOx | 0 atomic % | 1.64 | 21.62 |
| Comparative example 3 | Sputtering method | 500 | WOx | 0 atomic % | 1.76 | 23.14 |
| Comparative example 4 | Sputtering method | 1000 | WOx | 0 atomic % | 1.66 | 20.24 |
| Comparative example 5 | Wet application method | — | PEDOT | — | 0.82 | 10.90 |

The surface flatness of the film was sufficient in Example 1 in which the film was formed on the same condition as the hole injection layer 13 included in the organic EL element according to the present invention, and was equivalent to the surface roughness of the PEDOT film that was used as a reference. According to this, the Mo-doped WOx film that is the hole injection layer of the organic EL element according to the present invention can be formed on a condition for forming the film having a film thickness equivalent to that of the PEDOT film. Moreover, by using the Mo-doped WOx film as the hole injection layer, no acceleration of device deterioration or no erosion or leakage current of a manufacturing apparatus is caused as observed in the case of using the PEDOT film as the hole injection layer.

In contrast, in Comparative Examples 2 to 4, the surface roughness of the film (WOx film) made only of tungsten oxide was approximately double the surface roughness of the PEDOT film. That is, the surface smoothness of the WOx film was worse than the smoothness of the PEDOT film. The same result was obtained even when the output power for the sputtering film forming was changed, that is, even when the film growth rate on the substrate was changed. In order to use this WOx film as the hole injection layer, compared to the case of using the Mo doping WOx film or the PEDOT film as the hole injection layer, the film thickness of the WOx film should be at least doubled. This increases a resistance value of the hole injection layer and thus fails to achieve a low voltage drive for the organic EL element, thus causing an increase in power consumption.

Note that it is necessary to optimize the film thickness of the hole injection layer according to increase in Mo doping amount by considering the film thickness of the organic luminescent layer, because the amount of film erosion increases as the Mo doping concentration increases.

Thus far, although the organic EL element and the manufacturing method thereof according to the present invention has been described based on the embodiment and examples, the present invention is not limited to the embodiment and examples. Those skilled in the art will readily appreciate that many modifications are possible in the exemplary embodiment without materially departing from the novel teachings and advantages of this invention. Accordingly, all such modifications are intended to be included within the scope of this invention.

Figure 8:
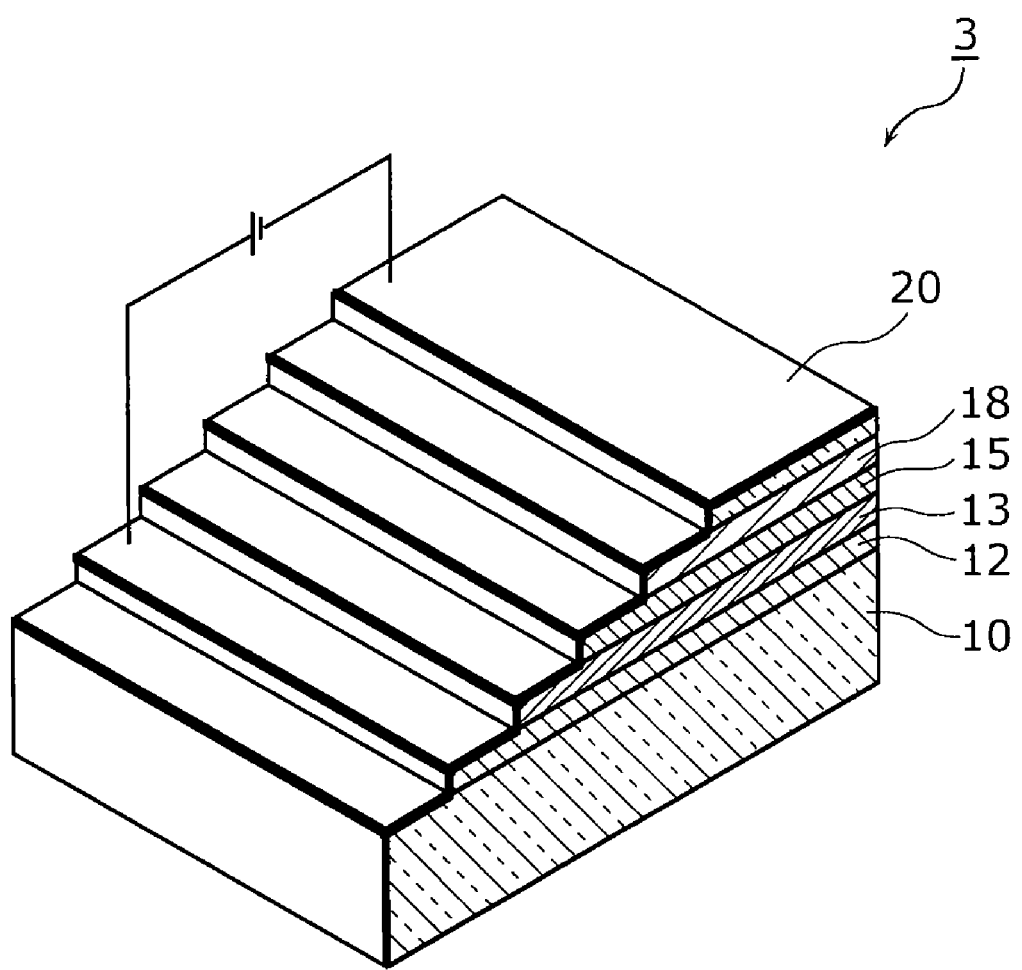
FIG. 8 is a structural schematic view of an organic EL illumination source using the organic EL element according to the embodiment of the present invention.

Note that the organic EL element according to the present invention may be uniformly formed on all or a major part of the substrate. In this case, it is possible to use the organic EL element as an illumination source which allows obtainment of larger-area illumination through a larger opening portion. FIG. 8 is a structural schematic view of an organic EL illumination source using the organic EL element according to an aspect of the present invention. An organic EL illumination source 3 shown in the figure is of the top emission type; thus, illumination light is emitted upward in the example shown in FIG. 8. With this structure, it is possible to facilitate the manufacturing of a large scale organic EL illumination source and the mass production thereof.

Alternatively, the electrode may also be patterned in such a manner as to display a particular graphic figure or a letter. In this case, it is possible to use the electrode for advertising display because illumination having a particular pattern can be obtained.

Figure 9:
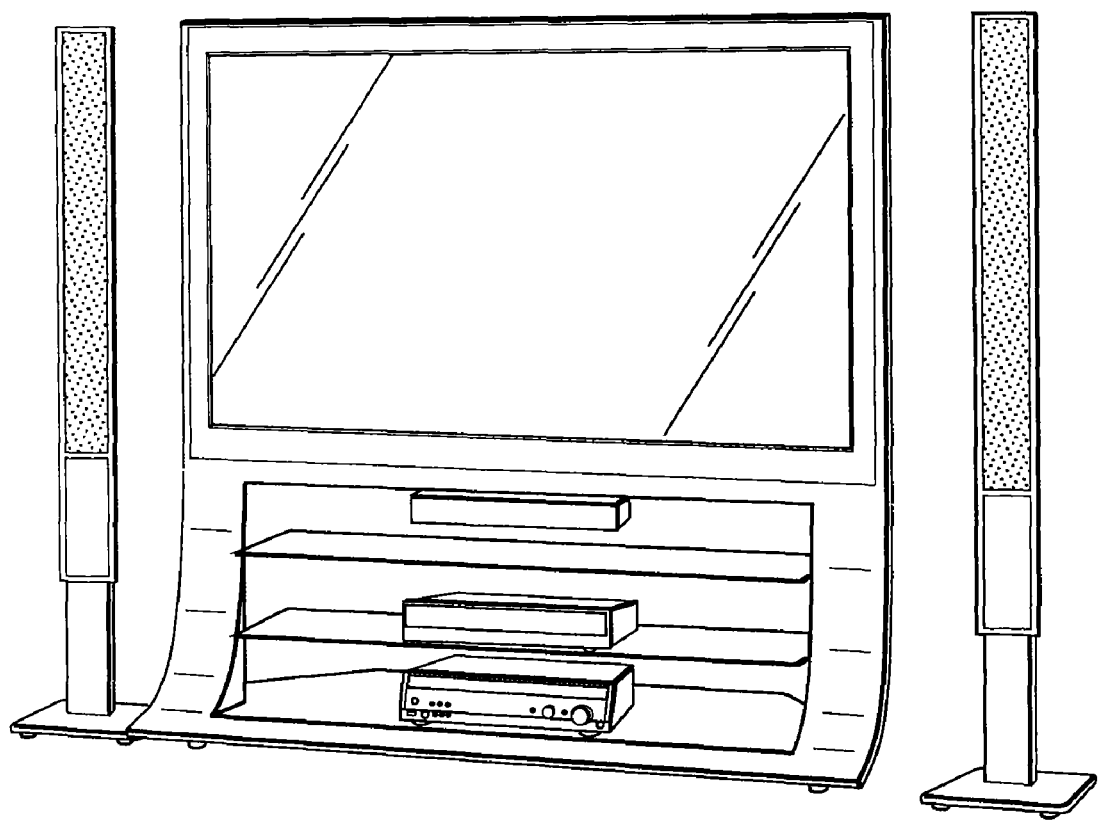
FIG. 9 is an external view of a flat-screen television into which the organic EL element according to the present invention is incorporated.

Alternatively, a number of such electrodes may be provided in a matrix. In this case, the electrodes can be used for a display panel apparatus such as a passive-drive display panel. Alternatively, active-matrix organic EL elements as shown in FIG. 1 are arranged two-dimensionally and incorporated in a thin flat TV as shown in FIG. 9, thereby achieving a thin flat TV that is a display apparatus requiring a low drive voltage and having high luminance efficiency.

Note that in the embodiment of the present invention, an example in which a polymer organic material is used for the hole injection layer 13 and the organic luminescent layer 15 has been described, but the same effect as in this consideration can be obtained even when a low-molecular organic material is used for such layers.

In addition, after forming the film of the hole injection layer 13 made of molybdenum oxide and tungsten oxide by the sputtering film forming method, the effect produced by the organic EL element according to the present invention, that is, the surface flatness and insolubility in water remains unchanged irrespective of whether or not annealing is performed on the film. Therefore, the present invention is not limited to whether or not an after-annealing process is provided.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

An organic EL element according to the present invention, which allows achieving reduced manufacturing costs and larger area, is thus useful for a pixel illumination source for a display device, a backlight for a liquid crystal display, and a variety of illumination sources, and is particularly applicable to an active-matrix organic EL display panel combined with a TFT.

What is claimed is:

1. An organic electroluminescence element, comprising:
    an anode;
    a cathode;
    an organic luminescent layer located between the anode and the cathode; and
    a hole injection layer located between the anode and the organic luminescent layer, the hole injection layer including a mixture of molybdenum oxide and tungsten oxide that contains a molybdenum element in a range of approximately 9 atomic percent to approximately 35 atomic percent.

2. The organic electroluminescence element according to claim 1,
    wherein the mixture contains the molybdenum element in a range of approximately 9 atomic percent to approximately 12 atomic percent.

3. The organic electroluminescence element according to claim 1,
    wherein a surface roughness Rmax of the hole injection layer is in a range of approximately 10 nm to approximately 20 nm.

4. The organic electroluminescence element according to claim 1,
    wherein the organic luminescent layer comprises a polymer organic material.

5. The organic electroluminescence element according to claim 1,
    wherein the hole injection layer is formed by a sputtering film forming method.

6. The organic electroluminescence element according to claim 5,
    wherein the hole injection layer is formed by the sputtering film forming method using a sputtering target containing molybdenum and tungsten in an atomic ratio in a range of approximately 65:35 to approximately 20:80.

7. The organic electroluminescence element according to claim 5,
    wherein the anode is formed by the sputtering film forming method.

8. The organic electroluminescence element according to claim 1,
    wherein the anode, the organic luminescent layer, and the cathode are stacked on a substrate in order,
    the anode contains at least one of Ag and Al, and
    the cathode is transparent.

9. A display panel apparatus, comprising the organic electroluminescence element according to claim 1.

10. A display apparatus, comprising the display panel apparatus according to claim 9.

11. An electroluminescence illumination source, comprising the organic electroluminescence element according to claim 1.

* * * * *